(12) United States Patent
Yoshihara

(10) Patent No.: US 10,643,909 B2
(45) Date of Patent: May 5, 2020

(54) INSPECTING METHOD FOR INSPECTING INFLUENCE OF INSTALLATION ENVIRONMENT UPON PROCESSING APPARATUS

(71) Applicant: DISCO CORPORATION, Tokyo (JP)

(72) Inventor: Hiroyuki Yoshihara, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 206 days.

(21) Appl. No.: 15/647,998

(22) Filed: Jul. 12, 2017

(65) Prior Publication Data

US 2018/0025953 A1 Jan. 25, 2018

(30) Foreign Application Priority Data

Jul. 19, 2016 (JP) .................................. 2016-141331

(51) Int. Cl.
| | |
|---|---|
| *H01L 21/66* | (2006.01) |
| *H01L 21/67* | (2006.01) |
| *H01L 21/68* | (2006.01) |
| *B23K 26/06* | (2014.01) |
| *B23K 26/08* | (2014.01) |
| *G01R 31/01* | (2020.01) |
| *G01R 31/28* | (2006.01) |

(52) U.S. Cl.
CPC .......... *H01L 22/24* (2013.01); *B23K 26/0626* (2013.01); *B23K 26/08* (2013.01); *G01R 31/01* (2013.01); *G01R 31/2851* (2013.01); *H01L 21/67092* (2013.01); *H01L 21/67259* (2013.01); *H01L 21/67276* (2013.01); *H01L 21/67288* (2013.01); *H01L 21/681* (2013.01); *G01R 31/2881* (2013.01)

(58) Field of Classification Search
CPC ............... H01L 22/24; H01L 21/67288; H01L 21/67276; H01L 23/544; G01R 31/01; G01R 31/2851; B23K 26/08; B23K 26/0626

See application file for complete search history.

(56) References Cited

U.S. PATENT DOCUMENTS

| | | | | |
|---|---|---|---|---|
| 5,644,245 A | * | 7/1997 | Saitoh ................ | G01R 1/06794 324/750.18 |
| 2015/0346611 A1 | * | 12/2015 | Noda ................... | G03F 7/70775 355/75 |
| 2017/0199225 A1 | * | 7/2017 | Takesako ........... | G01R 1/06794 |

FOREIGN PATENT DOCUMENTS

| | | |
|---|---|---|
| JP | 2013-044421 | 3/2013 |
| JP | 2014-011267 | 1/2014 |

* cited by examiner

*Primary Examiner* — Brigitte A Paterson
(74) *Attorney, Agent, or Firm* — Greer Burns & Crain, Ltd.

(57) ABSTRACT

A method for inspecting the influence of an installation environment upon a processing apparatus includes setting a mark for specifying a relative positional relation between a chuck table and a processing unit, imaging the mark plural times by using an imaging unit when a moving unit is at rest, and detecting the position of the mark from an image and then determining whether or not the influence of the installation environment upon the processing apparatus is present based on whether the change in position of the mark is less than or more than a threshold.

22 Claims, 4 Drawing Sheets

INSPECTING METHOD FOR INSPECTING INFLUENCE OF INSTALLATION ENVIRONMENT UPON PROCESSING APPARATUS

BACKGROUND OF THE INVENTION

Field of the Invention

The present invention relates to an inspecting method for inspecting the influence of an installation environment upon a processing apparatus.

Description of the Related Art

In a manufacturing process for device chips, a plurality of crossing division lines called streets are set on the front side of a wafer formed of silicon or compound semiconductor to thereby define a plurality of separate regions, and a plurality of devices such as integrated circuits (ICs), large scale integrations (LSIs) are formed in these respective separate regions. The wafer thus having the devices on the front side is divided along the division lines to manufacture individual device chips. In dividing the wafer, a processing apparatus such as a cutting apparatus and a laser processing apparatus is used. Such a processing apparatus is also used in dividing a workpiece such as a packaged substrate, a ceramic substrate, and a glass substrate. In recent years, the device chips remarkably tend to become finer and the level required for the processing accuracy of the processing apparatus is accordingly increasing. To realize a high level of processing accuracy, a processing unit (cutting blade or laser beam) included in the processing apparatus must be controlled with high accuracy.

In many cases, an installation surface (floor surface) on which the processing apparatus is installed in a factory or the like is a surface formed by arranging steel members into a grid (grating) or a raised surface. When the processing apparatus is installed on such a surface, there is a possibility that vibrations or the like may be transmitted from any other apparatuses or facilities to the processing apparatus and that the control of the processing unit may therefore be influenced by the vibrations transmitted. To relax this influence, various measures have been taken. For example, Japanese Patent Laid-open No. 2013-44421 discloses a technique regarding a vibration isolation fixture for preventing the propagation of the vibrations of the installation surface to the processing apparatus. By supporting the processing apparatus to the vibration isolation fixture, the influence of the vibrations from an installation environment outside the processing apparatus can be relaxed to thereby allow stable processing.

However, even when the processing apparatus is supported to such a vibration isolation fixture, there is a case that a processing result may vary. Further, it is generally difficult to determine whether such variations in processing result are caused by the fact that the influence of the installation environment cannot be sufficiently relaxed or due to any other causes. Accordingly, it is not easy to take any measures against a problem regarding undetermined cause. Further, there is also a case that variations in processing result may be caused by vibrations generated from the processing apparatus itself. For example, such vibrations may be generated in rotating a cutting blade at high speeds or moving a chuck table at high speeds, causing the variations in processing result. Japanese Patent Laid-open No. 2014-11267 discloses a technique of attaching a variable weight to the cutting blade or the chuck table to thereby shift the frequency of the vibrations generated in the processing apparatus from the frequency of the vibrations transmitted from the outside of the processing apparatus, thus reducing the effect by resonance.

SUMMARY OF THE INVENTION

In principle, when the relative positional relation between the chuck table and the processing unit is fixed and the chuck table and the processing unit vibrate in the same way, there is no possibility that the installation environment of the processing apparatus may have an influence on the processing result. However, a laser measuring instrument or the like must be mounted on the processing apparatus to verify that the relative positional relation between the chuck table and the processing unit is fixed. However, when such an instrument for verifying that the relative positional relation is fixed is mounted on the processing apparatus, an increase in cost is invited. Further, there is a case that a sufficient space for mounting the instrument cannot be ensured, depending on the configuration of the processing apparatus and that the instrument cannot therefore be mounted on the processing apparatus.

It is therefore an object of the present invention to provide an inspecting method which can evaluate a change in relative positional relation between the chuck table and the processing unit to inspect the influence of an installation environment upon the processing apparatus, without the need for mounting any new measuring instrument to the processing apparatus.

In accordance with an aspect of the present invention, there is provided an inspecting method for inspecting the influence of an installation environment upon a processing apparatus including a chuck table for holding a workpiece, a processing unit processing the workpiece held on the chuck table, moving mechanism for relatively moving the chuck table and the processing unit, and an imaging unit fixed to the processing unit to image the workpiece held on the chuck table, the inspecting method including a mark setting step of setting a mark for specifying a relative positional relation between the chuck table and the processing unit; an imaging step of imaging the mark plural times by using the imaging unit in the condition where the moving mechanism is at rest; and a determining step of detecting the position of the mark from an image obtained by the imaging step and then determining whether or not the influence of the installation environment upon the processing apparatus is present; the determining step being performed in such a manner that when the amount of change in position of the mark is less than a threshold, it is determined that the relative positional relation between the chuck table and the processing unit is not influenced by the installation environment, whereas when the amount of change in position of the mark is greater than or equal to the threshold, it is determined that the relative positional relation between the chuck table and the processing unit is influenced by the installation environment.

Preferably, the imaging step includes setting the distance between the imaging unit and the chuck table so that the imaging unit focuses the mark, and next starting to image the mark. Preferably, the mark is set on the chuck table or on an object held on the chuck table.

In the inspecting method according to the present invention, the imaging unit to be used in positioning the processing unit relative to the chuck table is used in inspecting the influence of an installation environment upon the processing apparatus. That is, the imaging unit is originally used to confirm a processing position in processing a workpiece by using the processing unit and to move the processing unit to a predetermined position. In the inspecting method according to the present invention, this imaging unit is also used for the inspection, so that it is unnecessary to newly provide any measuring instrument or the like for performing the inspection to the processing apparatus.

The imaging unit is fixed to the processing unit, so that when the processing unit is vibrated, the imaging unit is also vibrated. By using the imaging unit to image the mark for specifying the position of the chuck table in the processing apparatus plural times, a change in relative positional relation between the processing unit and the chuck table can be detected. By performing the inspection in the condition where both the processing unit and the chuck table are at rest, it can be determined whether or not an external environment outside the processing apparatus has an influence upon the relative positional relation between the processing unit and the chuck table.

By using an image obtained by the imaging unit to inspect the influence, an objective inspection result can be provided to a user or manager of the processing apparatus. When it is confirmed that the external environment has an influence upon the relative positional relation between the processing unit and the chuck table, any measures against this influence can be taken. Conversely, when it is confirmed that the external environment has no influence upon the relative positional relation between the processing unit and the chuck table, any causes of variations in processing result other than the external environment can be determined.

According to the present invention, it is possible to provide an inspecting method which can evaluate a change in relative positional relation between the chuck table and the processing unit to inspect the influence of an installation environment upon the processing apparatus, without the need for mounting any new measuring instrument to the processing apparatus.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
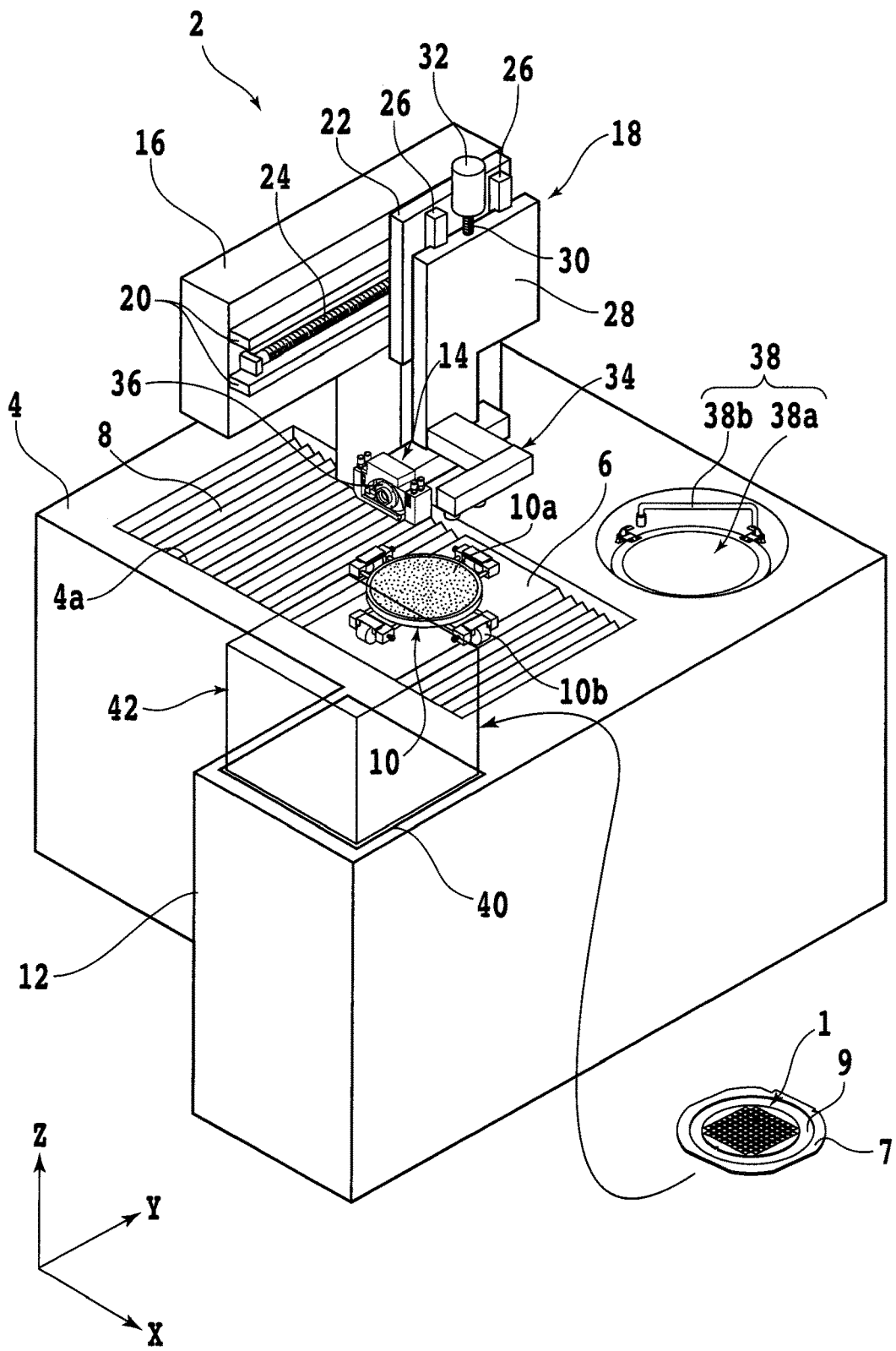
FIG. 1 is a schematic perspective view showing a processing apparatus including a processing unit and a chuck table.

A preferred embodiment of the present invention will now be described. First, a processing apparatus for performing an inspecting method according to this preferred embodiment will now be described. FIG. 1 is a schematic perspective view of a cutting apparatus 2 as an example of the processing apparatus. For example, the processing apparatus is installed in a factory for manufacturing device chips. There is a case that an installation surface (floor surface) on which the processing apparatus is installed in the factory is a surface formed by arranging steel members into a grid (grating) or a raised surface. When the processing apparatus is installed on such a surface, there is a possibility that the processing apparatus may be influenced by vibrations or the like transmitted from any other apparatuses or facilities.

The components of the processing apparatus (cutting apparatus) 2 will now be described with reference to FIG. 1. As shown in FIG. 1, the processing apparatus 2 includes a base 4 for supporting each component. The upper surface of the base 4 is formed with a rectangular opening 4a elongated in an X direction (feeding direction) shown by an arrow X. There are provided inside the opening 4a an X movable table 6 movable in the X direction, an X moving mechanism (moving means) (not shown) for moving the X movable table 6 in the X direction, and a dust-proof and drip-proof cover 8 for covering the X moving mechanism. The X moving mechanism includes a pair of parallel X guide rails (not shown) extending in the X direction. The X movable table 6 is slidably mounted on the X guide rails.

A nut portion (not shown) is formed on the lower surface of the X movable table 6, and an X ball screw (not shown) parallel to the X guide rails is threadedly engaged with this nut portion. An X pulse motor (not shown) is connected to one end of the X ball screw. Accordingly, when the X pulse motor is operated to rotate the X ball screw, the X movable table 6 is moved in the X direction along the X guide rails. A chuck table 10 for holding a wafer 1 under suction is provided on the X movable table 6. The chuck table 10 is connected to a rotational drive source (not shown) such as a motor. The chuck table 10 is rotatable around an axis substantially parallel to a Z direction (vertical direction) shown by an arrow Z. The chuck table 10 is adapted to be fed in the X direction by the X moving mechanism.

The upper surface of the chuck table 10 functions as a holding surface 10a for holding the wafer 1 under suction. A suction passage (not shown) is formed in the chuck table 10. The holding surface 10a is connected through the suction passage to a vacuum source (not shown). A plurality of clamps 10b are provided on the outer circumference of the chuck table 10, so as to fix an annular frame 7 supporting the wafer 1 through a tape 9. As shown in FIG. 1, the wafer 1 is attached to the tape 9 supported at its peripheral portion to the annular frame 7, thereby forming a wafer unit composed of the wafer 1, the tape 9, and the annular frame 7. In such a case of handling the wafer 1 supported through the tape 9 to the frame 7, the wafer 1 can be protected from any shock in transferring the wafer 1. Further, when the tape 9 is expanded, the wafer 1 can be divided into a plurality of device chips.

Reference numeral 16 denotes a support structure for a processing unit to be hereinafter described. A corner portion of the base 4 as spaced apart from the support structure 16 is formed as a projecting portion 12 projecting frontward of the base 4. A space is defined inside the projecting portion 12, and a vertically movable cassette elevator 40 is installed in this space. The cassette elevator 40 has an upper surface as a mount surface for mounting a cassette 42. The cassette 42 is capable of storing a plurality of wafers 1. Accordingly, the cassette 42 storing the plural wafers 1 is adapted to be mounted on the upper surface of the cassette elevator 40. A transfer unit (not shown) for transferring the wafer 1 from the cassette 42 to the chuck table 10 is provided in the vicinity of the opening 4*a*. Accordingly, the wafer 1 (supported by the annular frame 7) taken out of the cassette 42 is transferred to the chuck table 10 and placed on the holding surface 10*a* by operating the transfer unit.

The support structure 16 is provided on the upper surface of the base 4 so as to overhang the opening 4*a*. The support structure 16 functions to support a processing unit 14 for processing the wafer 1. A processing unit moving mechanism (moving means) 18 for moving the processing unit 14 in a Y direction (indexing direction) shown by an arrow Y and in the Z direction is provided on the front side of the support structure 16 at its upper portion. The processing unit moving mechanism 18 includes a pair of parallel Y guide rails 20 provided on the front side (front surface) of the support structure 16 so as to extend in the Y direction. A Y movable plate 22 movable in the Y direction is slidably mounted on the Y guide rails 20. A nut portion (not shown) is formed on the back side (rear surface) of the Y movable plate 22, and a Y ball screw 24 parallel to the Y guide rails 20 is threadedly engaged with this nut portion. A Y pulse motor (not shown) is connected to one end of the Y ball screw 24. Accordingly, when the Y pulse motor is operated to rotate the Y ball screw 24, the Y movable plate 22 is moved in the Y direction along the Y guide rails 20. Further, a pair of parallel Z guide rails 26 are provided on the front side (front surface) of the Y movable plate 22 so as to extend in the Z direction. A Z movable plate 28 movable in the Z direction is slidably mounted on the Z guide rails 26.

A nut portion (not shown) is formed on the back side (rear surface) of the Z movable plate 28, and a Z ball screw 30 parallel to the Z guide rails 26 is threadedly engaged with this nut portion. A Z pulse motor 32 is connected to one end of the Z ball screw 30. Accordingly, when the Z pulse motor 32 is operated to rotate the Z ball screw 30, the Z movable plate 28 is moved in the Z direction along the Z guide rails 26. The processing unit 14 for processing the wafer 1 is provided at a lower portion of the Z movable plate 28. Further, an imaging unit (camera) 34 for imaging the front side of the wafer 1 is fixed to the processing unit 14. When the Y movable plate 22 in the processing unit moving mechanism 18 is moved in the Y direction, the processing unit 14 and the imaging unit 34 are indexed together in the Y direction. Further, when the Z movable plate 28 in the processing unit moving mechanism 18 is moved in the Z direction, the processing unit 14 and the imaging unit 34 are vertically moved together in the Z direction.

In this preferred embodiment, the processing unit 14 is a cutting unit having a cutting blade. As shown in FIG. 1, the processing unit 14 includes a spindle (not shown) having a rotation axis extending in the Y direction and an annular cutting blade 36 mounted at one end of the spindle. A rotational drive source (not shown) such as a motor is connected to the other end of the spindle, thereby rotating the cutting blade 36 mounted on the spindle. Cutting by the cutting blade 36 is performed by moving the Z movable plate 28 to thereby lower the cutting blade 36 to a predetermined height, next rotating the cutting blade 36, and simultaneously operating the X moving mechanism to feed the chuck table 10 in the X direction. The processing unit 14 may be a laser processing unit for applying a laser beam. In this case, the processing unit 14 has a laser oscillator and a laser head, wherein a laser beam oscillated from the laser oscillator is applied through the laser head to the wafer 1 held on the chuck table 10. Laser processing by the laser beam is performed by adjusting an optical system to set the focal point of the laser beam at a predetermined depth in the wafer 1, next applying the laser beam to the wafer 1, and simultaneously operating the X moving mechanism (moving means) to feed the chuck table 10 in the X direction.

The imaging unit (camera) 34 functions to image the front side of the wafer 1 held on the chuck table 10. An image obtained by the imaging unit 34 is used in positioning the processing unit 14, so as to process a predetermined portion of the wafer 1. Further, as described later, the imaging unit 34 also functions to image a mark set on the chuck table 10 or on the wafer 1 or the like in performing the inspecting method according to this preferred embodiment. This mark is used in determining whether or not the influence of an external environment is present. For example, a charge-coupled device (CCD) camera or a complementary metal oxide semiconductor (CMOS) sensor may be used as the imaging unit 34.

The wafer 1 processed by the processing unit 14 is transferred from the chuck table 10 to a cleaning unit 38 by operating a transfer mechanism (not shown). The cleaning unit 38 includes a spinner table 38*a* for holding the wafer 1 under suction in a cylindrical cleaning space defined in the base 4. A rotational drive source (not shown) is connected to a lower portion of the spinner table 38*a*, so as to rotate the spinner table 38*a* at a predetermined speed. A cleaning fluid nozzle 38*b* for spraying a cleaning fluid (typically, a mixture of water and air) toward the wafer 1 is provided above the spinner table 38*a*. Accordingly, when the spinner table 38*a* holding the wafer 1 is rotated and the cleaning fluid is sprayed from the cleaning fluid nozzle 38*b*, the wafer 1 can be cleaned by the cleaning fluid. The wafer 1 thus cleaned in the cleaning unit 38 is next stored into the cassette 42 by operating a transfer mechanism (not shown).

The inspecting method according to this preferred embodiment will now be described. In the inspecting method, a mark setting step is first performed to set a mark for specifying a relative positional relation between the chuck table 10 and the processing unit 14. Thereafter, an imaging step is performed to image the mark plural times by using the imaging unit 34 in the condition where the moving means (the X moving mechanism, the processing unit moving mechanism, and the Z pulse motor) is at rest. Thereafter, a determining step is performed to detect the position of the mark from an image obtained by the imaging step and then determine whether or not the influence of an installation environment upon the processing apparatus 2 is present. Specifically, the determining step is performed in the following manner. In the case that the amount of change in position of the mark is less than a threshold, it is determined that the relative positional relation between the chuck table 10 and the processing unit 14 is not influenced by the installation environment. Conversely, in the case that the amount of change in position of the mark is greater than or equal to the threshold, it is determined that the relative positional relation between the chuck table 10 and the processing unit 14 is influenced by the installation environment.

The above-mentioned steps of the inspecting method according to this preferred embodiment will now be described in more detail. The mark setting step will first be described. The mark to be set in the mark setting step is used to specify a relative positional relation between the chuck table 10 and the processing unit 14. A change in this relation appears as a change in position of the mark in the range where the imaging unit 34 images. In the imaging step to be hereinafter described, this mark is imaged by the imaging unit 34. This mark is set on the chuck table 10 or on an object held on the chuck table 10. In the case that the mark is set on the object held on the chuck table 10, this object may be the wafer 1 to be processed by the processing apparatus 2 or may be a dedicated test piece prepared in imitation of the wafer 1 to perform the inspecting method. For example, a structure or pattern formed on the chuck table 10 or the object held on the chuck table 10 may be set as the mark. Further, a structure (structural body) may be provided on the chuck table 10 or on the object held on the chuck table 10, and the mark may be set on this structure. In the case that the wafer 1 as a workpiece is used as the object (test piece) on which the mark is to be set, a circuit pattern in a device formed on the wafer 1 may be set as the mark. In this case, it is unnecessary to provide a structure on the wafer 1.

Figure 2A:
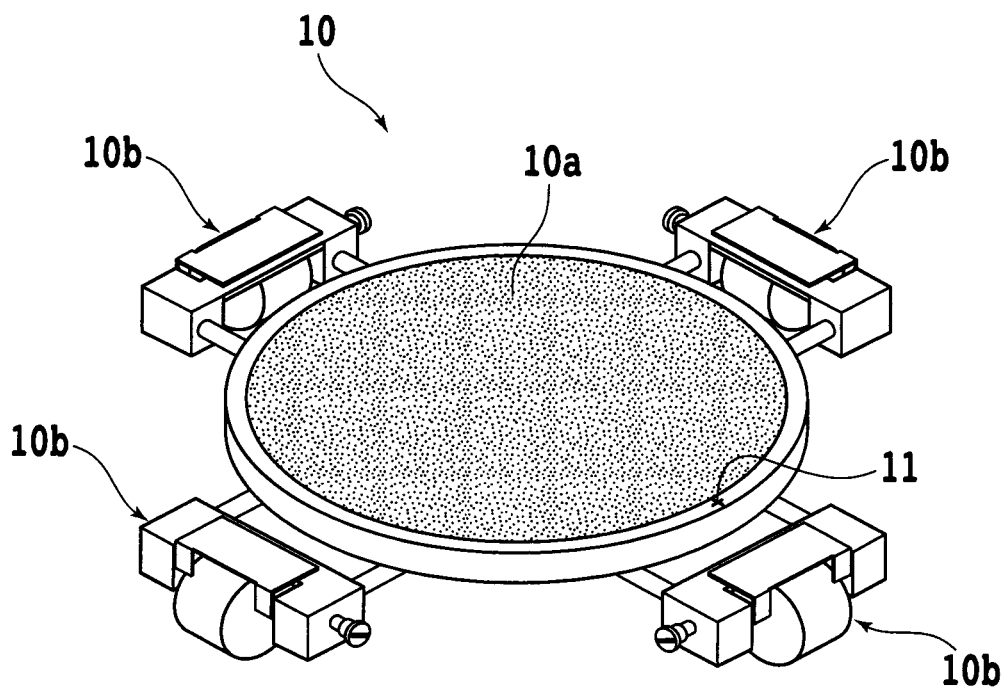
FIG. 2A is a schematic perspective view showing a mark set on the chuck table.
Figure 2B:
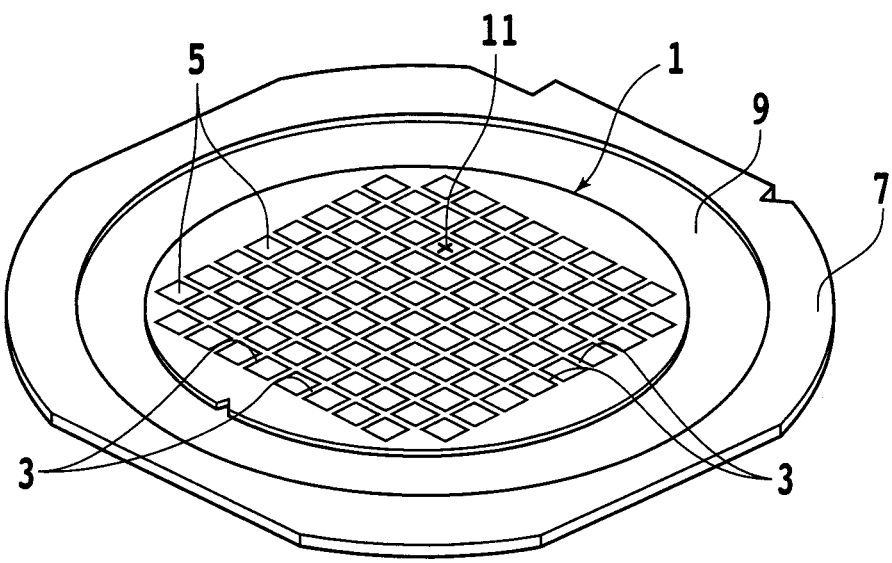
FIG. 2B is a schematic perspective view showing a mark set on an object (test piece) held on the chuck table.

Some examples of the mark are shown in FIGS. 2A and 2B. FIG. 2A is a schematic perspective view showing a mark 11 formed on a peripheral portion of the chuck table 10. The mark 11 shown in FIG. 2A is formed on the upper surface of the chuck table 10 so as to be imaged by the imaging unit 34. The mark 11 is formed of any material that can be imaged by the imaging unit 34. For example, the mark 11 is formed of metal or light shielding resin. Further, the mark 11 may be formed by drawing with light shielding ink or by laser marking. The shape of the mark 11 is preferably selected so that a change in relative positional relation between the chuck table 10 and the processing unit 14 can be easily detected. For example, the shape of the mark 11 may be a cross shape as shown in FIG. 2A or may be a scale shape formed by arranging a plurality of parallel lines (graduations).

FIG. 2B is a schematic perspective view showing another example such that a pattern formed on the wafer 1 as a workpiece to be processed by the processing apparatus 2 is set as the mark 11. As shown in FIG. 2B, the front side of the wafer 1 is partitioned by a plurality of crossing division lines 3 to thereby define a plurality of separate regions where a plurality of devices 5 such as ICs are individually formed. The wafer 1 thus having the plural devices 5 is finally divided along these division lines 3 to obtain a plurality of individual device chips.

The wafer 1 is mounted through the tape 9 on the holding surface 10a of the chuck table 10. In this condition, the frame 7 is fixed by the clamps 10b of the chuck table 10. Thereafter, a vacuum is applied to the holding surface 10a of the chuck table 10, thereby holding the wafer 1 on the chuck table 10 under suction. There is a possibility that the relative positional relation between the chuck table 10 and the processing unit 14 may be varied by the influence of an external environment. As a result, the relative positional relation between the wafer 1 as a workpiece and the processing unit 14 is varied, so that the processing by the processing unit 14 is influenced by such variations in relative position. In the case that the mark 11 is set on the wafer 1, the wafer 1 is a test piece to be inspected. For example, a pattern is formed in or near the region where the device 5 is formed, and this pattern is set as the mark 11. The nearer to an actual processing position in the processing apparatus 2 the position of the mark 11 becomes, the more accurately the influence of an external environment upon the processing can be grasped.

The pattern to be set as the mark 11 may be formed of the material of a metal film or an insulating film constituting the device 5. By using the material of the film constituting the device 5, the mark 11 can be formed in the process of forming the devices 5 without the need for an additional step. Further, it is unnecessary to form any specific pattern for use in setting the mark 11, but a pattern such as wiring constituting the device 5 may be set as the mark 11. In this case, the inspecting method according to this preferred embodiment can be performed without the need for newly providing any special configuration on the processing unit 14, the chuck table 10, and the wafer 1. Further, any dedicated test piece may be prepared in imitation of the wafer 1 to only perform this inspection. In this case, the test piece is held on the chuck table 10 under suction and the mark 11 is set on the test piece to perform the inspection. This test piece is neither processed nor lost, so that it can be repeatedly used in performing the inspection plural times. Accordingly, every time the maintenance of the processing apparatus 2 is performed, the inspection can be performed under the same conditions and plural inspection results can be compared, so that a change in the influence of an external environment can be accurately grasped.

Figure 3:
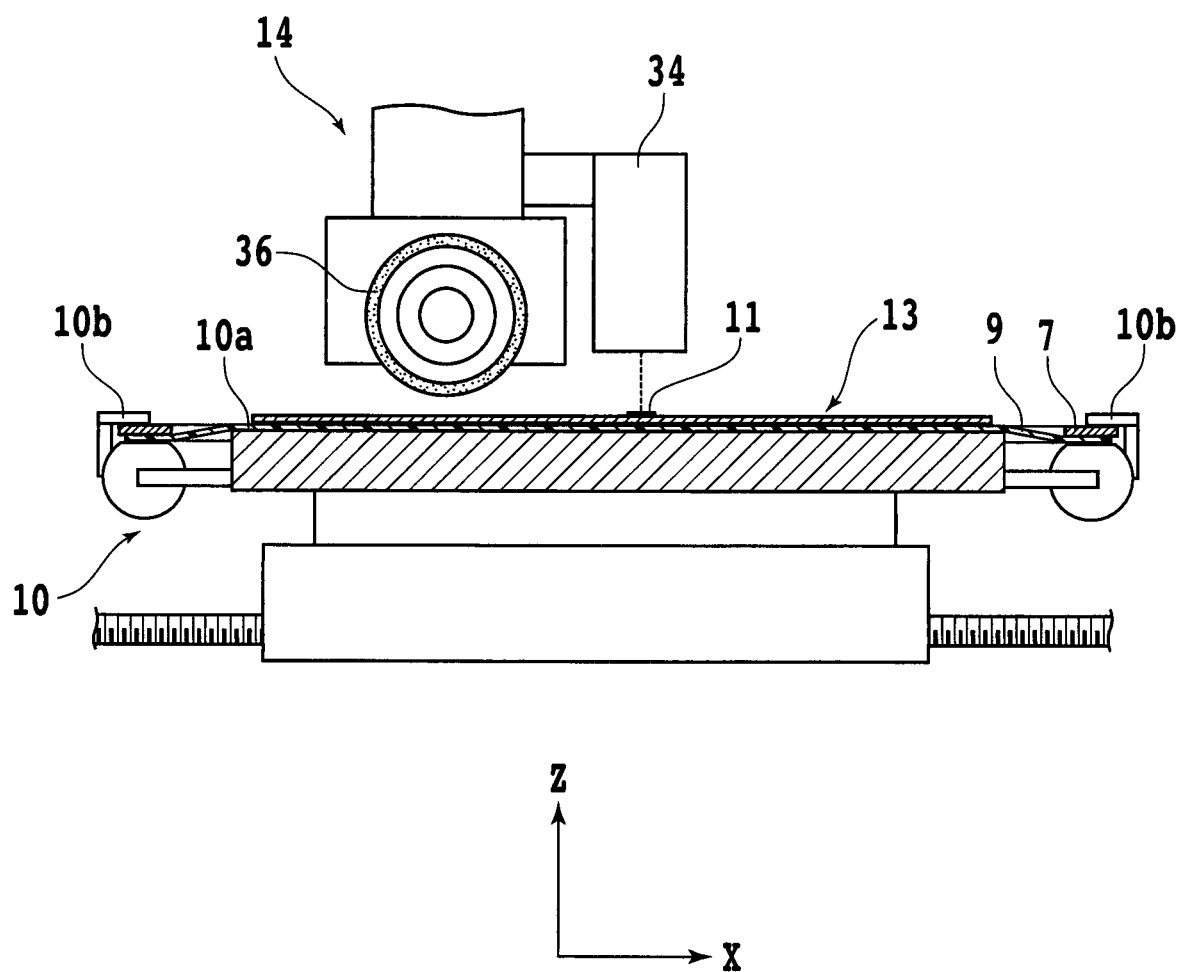
FIG. 3 is a schematic sectional view showing a positional relation between an imaging unit fixed to the processing unit and a test piece held on the chuck table in imaging the mark.

The imaging step in the inspecting method according to this preferred embodiment will now be described. FIG. 3 is a schematic sectional view showing the relation among the processing unit 14, the chuck table 10, and the mark 11 in the imaging step. As shown in FIG. 3, the mark 11 is set on a test piece 13 (the wafer 1 or a dedicated test piece), and the mark 11 is imaged by the imaging unit 34. The test piece 13 is held on the chuck table 10. In the imaging step, the processing unit 14 and the chuck table 10 are first moved so that the mark 11 can be imaged by the imaging unit (camera) 34 fixed to the processing unit 14. Thereafter, the distance between the imaging unit 34 and the chuck table 10 is set so that the imaging unit 34 focuses the mark 11. After moving the imaging unit 34 to the position where the mark 11 is to be imaged, the processing unit 14 and the chuck table 10 are relatively stopped. In other words, the moving means (the X moving mechanism, the processing unit moving mechanism, and the Z pulse motor) is stopped in operation to thereby make a rest condition that the generation of vibrations due to the processing apparatus 2 is minimized. Thereafter, imaging by the imaging unit 34 is started.

The processing apparatus 2 is installed in a clean room or the like in a factory for manufacturing device chips. For example, there are provided inside or outside the clean room in the factory a cleaning apparatus for keeping the cleanliness of air, an air conditioning facility for managing temperature and humidity, and evacuating units connected to various kinds of apparatuses. Further, a plurality of other processing apparatuses are usually provided inside the clean room. There is a case that an installation surface (floor surface) on which the processing apparatus 2 is installed in the factory is a surface formed by arranging steel members into a grid (grating) or a raised surface. When the processing apparatus 2 is installed on such a surface, there is a possibility that the processing apparatus 2 may be influenced by vibrations or the like transmitted from any other apparatuses or facilities. A main part of the external environment possibly having an influence upon the processing by the processing apparatus 2 is vibrations generated from any other apparatuses or facilities. To evaluate the influence of such vibrations, the imaging must be performed plural times. Since such vibrations are generated steadily, it is unnecessary to continuously perform the imaging at all times, but the influence of the external environment can be sufficiently evaluated by performing the imaging plural times.

Figure 4A:
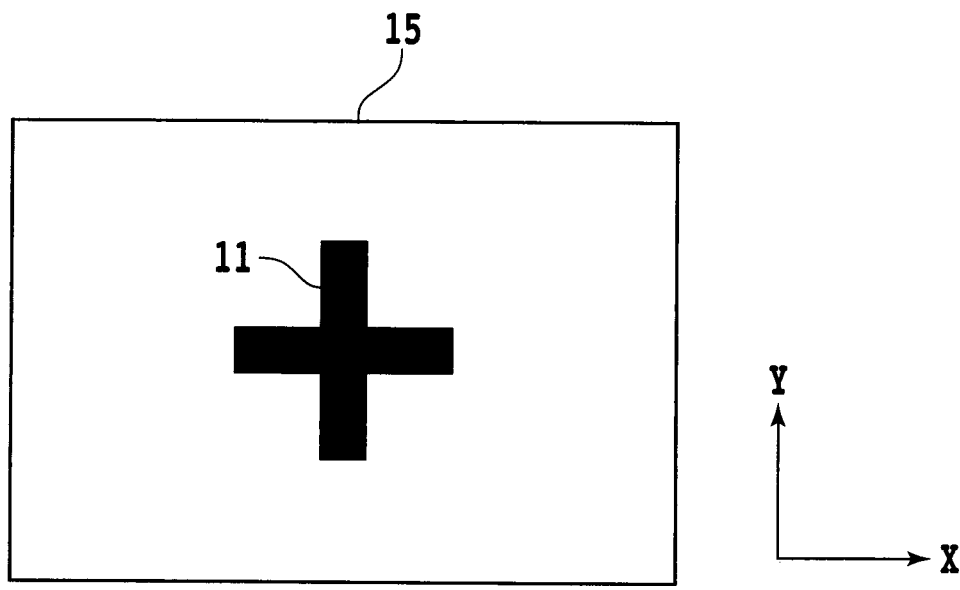
FIG. 4A is a schematic plan view showing an image obtained by the imaging unit.

FIG. 4A shows an image 15 obtained by the imaging unit 34 as an example. As shown in FIG. 4A, the mark 11 is included in the image 15. In the imaging step, a plurality of such images 15 are obtained. In the determining step to be hereinafter described, the positions of the marks 11 individually included in these plural images 15 are detected and these positions are then compared with each other to derive the amount of change in position of the mark 11, thus evaluating the amount of change. The amount of change to be evaluated by comparing the plural images 15 is not only the amount of change in position of the mark 11 in a plane parallel to the holding surface 10a of the chuck table 10. That is, by comparing the sharpness (or blurriness) of the outlines of the marks 11 in the plural images 15, it is possible to evaluate the presence or absence of a change in position of the mark 11 in a direction perpendicular to the holding surface 10a. The imaging unit 34 may provide a still picture or a moving picture. In the case that the imaging unit 34 provides a still picture, a plurality of images obtained by the imaging unit 34 are used to evaluate the amount of change in position of the mark 11. In the case that the imaging unit 34 provides a moving picture, a plurality of images are prepared from the moving picture, and these plural images are then used to evaluate the amount of change in position of the mark 11.

The determining step in the inspecting method according to this preferred embodiment will now be described. In the determining step, the position of the mark 11 is detected from each image obtained in the imaging step, and it is then determined whether or not the influence of an external environment upon the processing apparatus 2 is present, according to the result of this detection. More specifically, in the determining step, the positions of the marks 11 included in the plural images 15 obtained in the imaging step are detected. Thereafter, these plural positions detected above are compared with each other to derive the amount of change in position of the mark 11. The process of deriving the amount of change in position of the mark 11 will now be described with reference to FIGS. 4A and 4B. FIG. 4A shows an image obtained by the imaging unit 34 and FIG. 4B shows another image obtained by the imaging unit 34 at the time different from the time when the image shown in FIG. 4A is obtained.

Figure 4B:
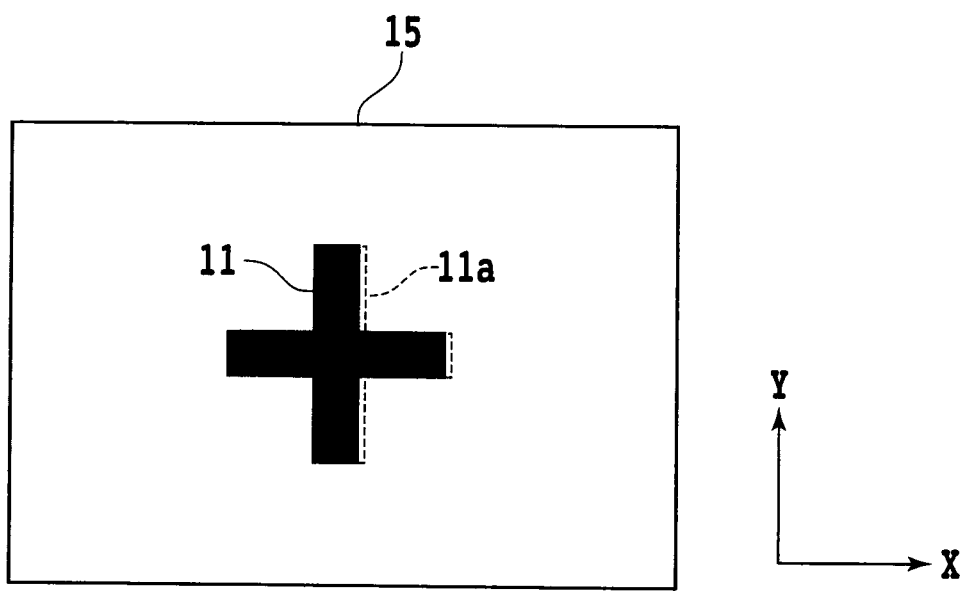
FIG. 4B is a schematic plan view showing another image obtained by the imaging unit in the case that the relative positional relation between the chuck table and the processing unit has been changed.

The position of the mark 11 in the image 15 shown in FIG. 4A is used as a reference position, and the position of the mark 11 in the image 15 shown in FIG. 4B is evaluated by using the above reference position. In FIG. 4B, reference numeral 11a denotes the reference position. That is, the reference position 11a shown in FIG. 4B is the same as the position of the mark 11 shown in FIG. 4A. In comparing the position of the mark 11 and the reference position 11a shown in FIG. 4B, a change in position of the mark 11 in the X direction (feeding direction) is recognized. Further, no change in position of the mark 11 in the Y direction (indexing direction) is recognized. Further, the sharpness of the outline of the mark 11 shown in FIG. 4A and the sharpness of the outline of the mark 11 shown in FIG. 4B are similar and no change in position of the mark 11 in the Z direction is also recognized. In this manner, by comparing the plural images 15, the amount of change in position of the mark 11 can be derived.

Thereafter, the amount of change in position of the mark 11 is evaluated in the following manner. There is a case that the relative positional relation between the chuck table 10 and the processing unit 14 in the processing apparatus 2 may change regardless of the influence of an external environment. Accordingly, unless a change in position due to an external environment is appropriately distinguished from a change in position not due to an external environment, the influence of an external environment cannot be properly evaluated. Therefore, a threshold is previously set on the basis of a change in position of the mark 11 not due to an external environment. In the case that the amount of change in position of the mark 11 is less than the threshold, it is determined that the external environment has no influence upon the relative positional relation between the chuck table 10 and the processing unit 14. Conversely, in the case that the amount of change in position of the mark 11 is greater than or equal to the threshold, it is determined that the external environment has an influence upon the relative positional relation between the chuck table 10 and the processing unit 14.

The threshold may be set not on the basis of a change in position of the mark 11 not due to an external environment. For example, in the case of evaluating both the external environment outside the processing apparatus 2 and any internal cause inside the processing apparatus 2 to take any measures, the threshold may be set to a smaller value. Further, the threshold may be set to the amount of change such that the influence upon the processing result is allowably small or almost zero. In this manner, by using the plural images 15 to evaluate the amount of change in position of the mark 11, the external environment outside the processing apparatus 2 can be objectively evaluated. For example, when variations in the processing result obtained by the processing apparatus 2 are recognized and it is understood that these variations are not caused by the influence of the external environment, the cause of these variations can be examined from any causes other than the external environment. Conversely, when it is concluded that the variations are caused by the influence of the external environment, any measures can be taken so as to relax the influence of the external environment.

As described above, the inspecting method according to this preferred embodiment can confirm the relative positional relation between the chuck table 10 and the processing unit 14 to inspect the influence of an installation environment upon the processing apparatus 2, without the need for mounting any new measuring instrument or the like to the processing apparatus 2.

The present invention is not limited to the above preferred embodiment, but various modifications may be made. For example, while the positions of the marks 11 included in the two images 15 are compared with each other to derive the amount of change in position of the mark 11 in the determining step as shown in FIGS. 4A and 4B, the method of deriving the amount of change in position of the mark 11 in the determining step is not limited to the above method.

For example, in reading the positions of the marks 11 from the plural images 15, a temporary origin may be defined in a plane parallel to the holding surface 10a of the chuck table 10. Further, the position of the mark 11 in each image 15 may be plotted in a temporary coordinate system having the above-defined temporary origin as a reference. Further, the average of the positions of the marks 11 plotted in the temporary coordinate system may be determined and a coordinate system having the average position as an origin may be newly set. Then, the positions of the marks 11 may be plotted again in this coordinate system. As a result, the plural points plotted in this coordinate system can be statistically handled. For example, by using one of the plural points plotted in the coordinate system farthest from the origin, the amount of change in position of the mark 11 may be derived. Further, a standard deviation may be determined from the statistical handling of the plural points, and the amount of change in position of the mark 11 may be derived by using this standard deviation.

Further, a change in position of the mark 11 may be expressed in a graph having a time axis. In the case that the graph reflects vibrations caused by an external environment, there is a case that the graph shows a waveform obtained by superimposing different kinds of vibrations having specific periods. In this case, by analyzing the graph to obtain the frequency of each kind of vibrations, the source of each kind of vibrations can be easily specified. For example, when the frequency of one of the different kinds of vibrations obtained by the analysis of the graph is the same as the frequency of vibrations generated from a vacuum pump connected to any other apparatus adjacent to the processing apparatus 2, the vacuum pump can be specified as the source of vibrations caused by the external environment.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. An inspecting method for inspecting an influence of an installation environment upon a processing apparatus including a chuck table for holding a workpiece, a processing unit processing said workpiece held on said chuck table, a moving mechanism for relatively moving said chuck table and said processing unit, and an imaging unit fixed to said processing unit to image said workpiece held on said chuck table, said inspecting method comprising:
    a mark setting step of setting a mark for specifying a relative positional relation between said chuck table and said processing unit:
    an imaging step of imaging said mark plural times, thereby creating a plurality of images of said mark, by using said imaging unit in the condition where said moving mechanism is at rest; and
    a determining step of detecting a change in a position of said mark across time from said plurality of images obtained by said imaging step and then determining whether or not the influence of said installation environment upon said processing apparatus is present;
    said determining step being performed in such a manner that when the amount of change in position of said mark is less than a threshold, it is determined that the relative positional relation between said chuck table and said processing unit is not influenced by said installation environment, whereas when the amount of change in position of said mark is greater than or equal to said threshold, it is determined that the relative positional relation between said chuck table and said processing unit is influenced by said installation environment,
    wherein said imaging unit and said processing unit are both fixed to a movable plate that is configured and arranged to be moved, with respect to said chuck table, in at least one direction, and
    wherein said processing unit comprises a laser processing unit for applying a laser beam to said workpiece.

2. The inspecting method according to claim 1, wherein said imaging step includes setting a distance between said imaging unit and said chuck table so that said imaging unit focuses on said mark, and next starting to image said mark.

3. The inspecting method according to claim 1, wherein said mark is set on said chuck table or on an object held on said chuck table.

4. The inspecting method according to claim 1, wherein said threshold is previously set on the basis of a change in position of said mark at a time when there is no change in said position of said mark due to an external environment.

5. The inspecting method according to claim 1, wherein said determining step further comprises defining a temporary origin and temporary coordinate system in a plane parallel to said surface of said chuck table, and wherein the position of the mark in each of the plurality of images is plotted on said temporary coordinate system, establishing a set of points.

6. The inspecting method according to claim 5, wherein said determining step further comprises calculating an average point from said set of points.

7. The inspecting method according to claim 6, wherein said determining step further comprises establishing a second coordinate system, said second coordinate system having a second origin defined by said average point.

8. The inspecting method according to claim 7, wherein said change in the position of the mark is defined as the distance between said second origin and the position of the mark having the greatest distance from said second origin.

9. The inspecting method according to claim 7, wherein said change in the position of the mark is defined as the standard deviation of a set, said set comprising the distances between each point in said set of points and said second origin.

10. The inspecting method according to claim 1, wherein said determining step further comprises plotting the change in the position of the mark against a time axis.

11. The inspecting method according to claim 10, wherein said plot is compared to waveforms of known vibrations in the installation environment.

12. The inspecting method according to claim 10, wherein said plot is compared to waveforms of known vibrations in the processing apparatus.

13. The inspecting method according to claim 1, wherein said mark is set on said chuck table.

14. The inspecting method according to claim 1, wherein said mark is set on an object held on said chuck table.

15. The inspecting method according to claim 1, wherein said mark is set on said workpiece.

16. The inspecting method according to claim 1, wherein said determining step includes comparing the sharpness of outlines of the plurality of images of said mark.

17. The inspecting method according to claim 1, wherein said imaging unit and said processing unit are in a fixed relationship to each other, such that when said processing unit is vibrated, said imaging unit is also vibrated.

18. An inspecting method for inspecting an influence of an installation environment upon a processing apparatus including a chuck table for holding a workpiece, a processing unit processing said workpiece held on said chuck table, a moving mechanism for relatively moving said chuck table and said processing unit, and an imaging unit fixed to said processing unit to image said workpiece held on said chuck table, said inspecting method comprising:
    a mark setting step of setting a mark for specifying a relative positional relation between said chuck table and said processing unit:
    an imaging step of imaging said mark plural times, thereby creating a plurality of images of said mark, by using said imaging unit in the condition where said moving mechanism is at rest; and
    a determining step of detecting a change in a position of said mark across time from said plurality of images obtained by said imaging step and then determining whether or not the influence of said installation environment upon said processing apparatus is present;
    said determining step being performed in such a manner that when the amount of change in position of said mark is less than a threshold, it is determined that the relative positional relation between said chuck table and said processing unit is not influenced by said installation environment, whereas when the amount of change in position of said mark is greater than or equal to said threshold, it is determined that the relative positional relation between said chuck table and said processing unit is influenced by said installation environment, wherein said imaging unit and said processing unit are both fixed to a movable plate that is configured and arranged to be moved, with respect to said chuck table, in at least one direction, and wherein said processing unit comprises a cutting unit including a rotatable cutting blade.

19. The inspecting method according to claim 18, wherein said imaging step includes setting a distance between said imaging unit and said chuck table so that said imaging unit focuses on said mark, and next starting to image said mark.

20. The inspecting method according to claim 18, wherein said mark is set on said chuck table or on an object held on said chuck table.

21. The inspecting method according to claim 18, wherein said determining step further comprises plotting the change in the position of the mark against a time axis.

22. The inspecting method according to claim 18, wherein said imaging unit and said processing unit are in a fixed relationship to each other, such that when said processing unit is vibrated, said imaging unit is also vibrated.

* * * * *